(12) United States Patent
Higuchi et al.

(10) Patent No.: US 8,413,322 B2
(45) Date of Patent: Apr. 9, 2013

(54) COMPONENT MOUNTING APPARATUS, COMPONENT MOUNTING HEAD, AND COMPONENT MOUNTING METHOD

(75) Inventors: Motohiro Higuchi, Nara (JP); Ryoji Inutsuka, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/741,719

(22) PCT Filed: Oct. 15, 2008

(86) PCT No.: PCT/JP2008/002909
§ 371 (c)(1),
(2), (4) Date: Jul. 13, 2010

(87) PCT Pub. No.: WO2009/060560
PCT Pub. Date: May 14, 2009

(65) Prior Publication Data
US 2010/0269330 A1    Oct. 28, 2010

(30) Foreign Application Priority Data

Nov. 6, 2007   (JP) .................. 2007-287967

(51) Int. Cl.
*H05K 3/30* (2006.01)
*H05K 3/20* (2006.01)
*B23P 19/00* (2006.01)
(52) U.S. Cl. ................ 29/832; 29/831; 29/739
(58) Field of Classification Search .............. 29/832, 29/831, 729, 739, 740, 741
See application file for complete search history.

(56) References Cited

U.S. PATENT DOCUMENTS

| | | | | |
|---|---|---|---|---|
| 4,979,290 A | * | 12/1990 | Chiba | 29/840 |
| 5,724,722 A | * | 3/1998 | Hashimoto | 29/740 |
| 6,178,621 B1 | * | 1/2001 | Shida et al. | 29/740 |
| 6,266,873 B1 | * | 7/2001 | Kitamura et al. | 29/832 |
| 6,282,779 B1 | * | 9/2001 | Nakano et al. | 29/832 |
| 6,289,256 B1 | * | 9/2001 | Takeda et al. | 700/121 |
| 7,325,298 B2 | * | 2/2008 | Kobayashi et al. | 29/740 |
| 2006/0112541 A1 | * | 6/2006 | Kobayashi et al. | 29/740 |
| 2006/0112545 A1 | * | 6/2006 | Hwang | 29/834 |

FOREIGN PATENT DOCUMENTS

| | | | |
|---|---|---|---|
| JP | 06-342997 | * | 12/1994 |
| JP | 08-330790 | * | 12/1996 |
| JP | 2005-032860 | * | 7/2003 |
| JP | 2004-158743 | * | 6/2004 |
| JP | 2005-032860 | * | 2/2005 |
| JP | 2005-142313 | * | 6/2005 |
| JP | 2007-109814 | * | 4/2007 |

OTHER PUBLICATIONS

International Search Report of PCT/JP2008/002909, dated Nov. 18, 2008 (1 page).

* cited by examiner

*Primary Examiner* — David Angwin
(74) *Attorney, Agent, or Firm* — Hamre, Schumann, Mueller & Larson, P.C.

(57) ABSTRACT

An object of the present invention is to provide a component a mounting apparatus capable of accurately determining minute mounting applied pressure. The component mounting head of the component mounting apparatus includes: a movable part having a suction bit section and a movable shaft, a weight compensation mechanism for engaging with the movable shaft to compensate for the gravitational force of the total weight of the movable part and a component suctioned to the suction bit section, on the basis of the total weight; a force determination unit for determining a force applied to the movable part in the vertical direction; and a drive unit for moving the force determination unit in the vertical direction. The control unit of the component mounting apparatus controls the drive unit in such a manner that the determination value of the force determination unit becomes a target value.

2 Claims, 7 Drawing Sheets

PRIOR ART

COMPONENT MOUNTING APPARATUS, COMPONENT MOUNTING HEAD, AND COMPONENT MOUNTING METHOD

TECHNICAL FIELD

The present invention relates to a component mounting apparatus such as an electronic component mounting apparatus for mounting electronic components on a substrate, a component mounting head provided in this component mounting apparatus, and a component mounting method.

BACKGROUND ART

Figure 7:
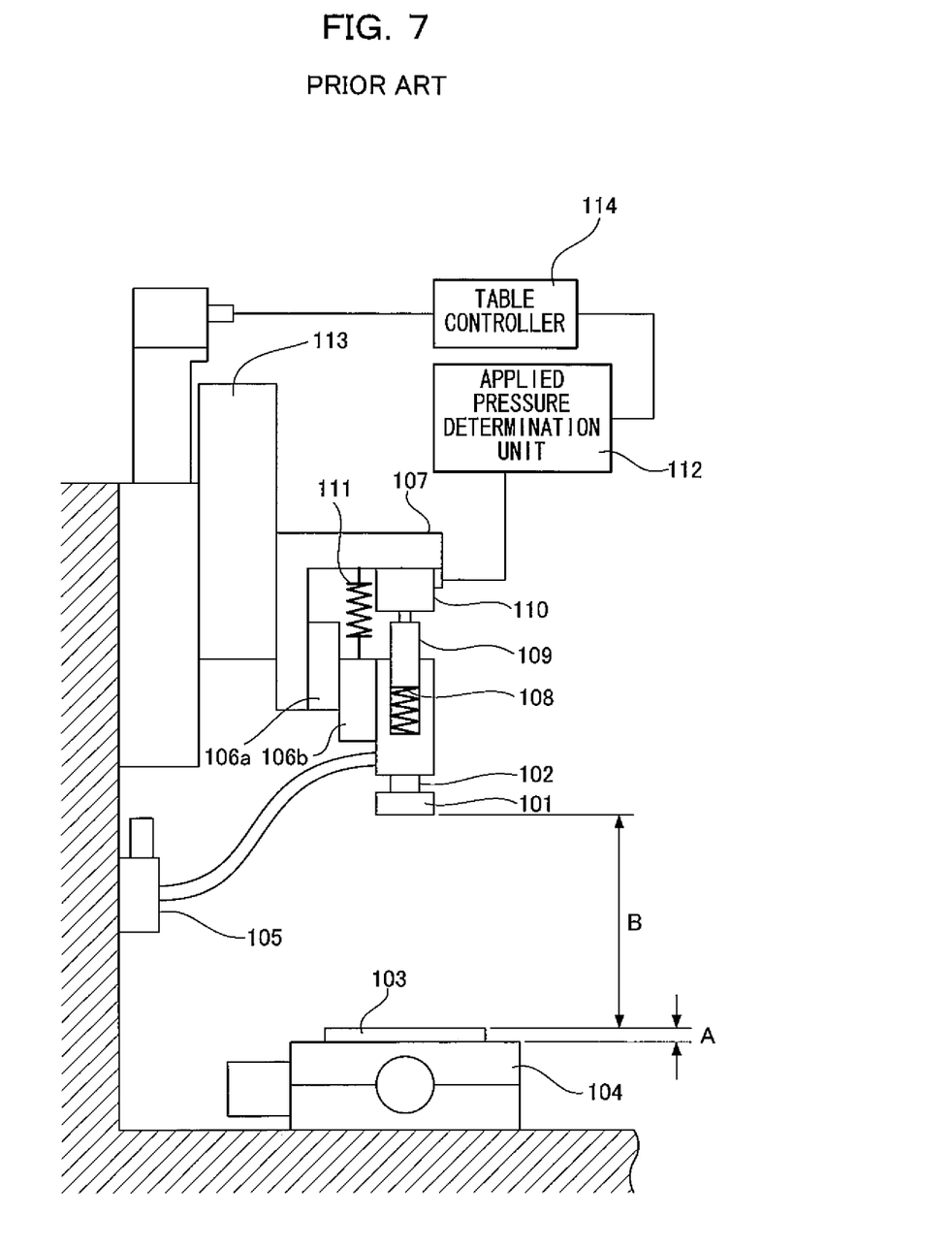
FIG. 7 is a schematic diagram showing a conventional bare chip mounter.

FIG. 7 is a schematic diagram showing the composition of a conventional bare chip mounter. A substrate 103 is mounted on the upper surface of an XY table 104. The XY table 104 moves the substrate 103 mounted thereon in the perpendicular direction along the horizontal plane. A suction nozzle unit 102 is connected to a vacuum generator 105. The upper surface of a bare chip 101 is suctioned to the front tip of the suction nozzle unit 102 due to the suctioning force of the vacuum generator 105.

A movable part 106b of a first single-axis table holds the suction nozzle unit 102. A fixing part 106a of the first single-axis table holds the movable part 106b movably in the vertical direction. The vertical (upward/downward) movement of the suction nozzle unit 106 is guided by the first single-axis table.

A bracket 107 holds the first single-axis table 106. A second single-axis table 113 holds the bracket 107. The second single-axis table 113 is moved in the vertical direction by a motor (not illustrated). The bracket 107 is moved upwards or downwards by the movement of the second single-axis table 113 in the vertical direction.

Furthermore, the bracket 107 holds a load cell 110. The pressure-sensitive surface of the load cell 110 is connected with the upper surface of a rod 109. The lower surface of the rod 109 is connected with the upper surface of a compression spring 108. The compression spring 108 presses the suction nozzle unit 102 downwards.

A pressure determination unit 112 outputs the determined pressure of the load cell 110 to a table controller 114. The table controller 114 drives the motor (not shown) which moves the second single-axis table 113 in the vertical direction, on the basis of the output from the pressure determination unit 112. In other words, the table controller 114 controls the upward/downward movement of the second single-axis table 113 on the basis of the output of the pressure determination unit 112.

Furthermore, the bracket 107 holds the upper end of a tensile spring 111. The lower end of the tensile spring 111 is connected with the upper surface of the movable part 106b of the first single-axis table. The tensile spring 111 generates a load equal to or greater than the weight of the movable part 106b of the first single-axis table, in a direction opposite to the load direction of the compression spring 108. In other words, the tensile spring 111 lifts up the movable part 106b of the first single-axis table.

In the conventional bare chip mounter composed in this way, when the bare chip 101 suctioned to the suction nozzle unit 102 is mounted on the printed pattern of the substrate 103, the second single-axis table 113 is moved downwards. In this case, the second single-axis table 113 is moved downwards through a pushing distance A in addition to a movement distance B before contacting the bare chip 101. Furthermore, in this case, the table controller 114 compares the determined pressure of the load cell 110 with a prescribed reference applied pressure.

Here, the reference applied pressure is a value obtained by adding a load generated by the compression spring 108 and the tensile spring 111 due to the pushing distance A, to an initial determination load determined by the load cell 110 before the bare chip 101 suctioned to the suction nozzle unit 102 comes into contact with the substrate 103.

When the second single-axis table 113 is moved downwards further through the pushing distance A after the bare chip 101 comes into contact with the substrate 103, the movable part 106b of the first single-axis table is moved upwards with respect to the second single-axis table 113. Due to this upward movement of the movable part 106b, the compression spring 108 is compressed and the tensile spring 111 is returned so as to generate the reference applied pressure described above.

Furthermore, when the second single-axis table 113 is moved downwards through the pushing distance A, the bare chip 101 is pressurized by the load generated by the compression spring 108 and the tensile spring 111 due to this pushing distance A. In other words, the load generated by the compression spring 108 and the tensile spring 111 due to the pushing distance A is a mounting applied pressure.

The table controller 114 halts the operation of the second single-axis table 113 at the time that an applied pressure determined by the pressure determination unit 112 reaches the reference applied pressure.

As described above, in the conventional bare chip mounter, the load generated by the compression spring and the tensile spring due to the pushing distance becomes the mounting applied pressure (see, for example, Patent Document 1).

However, in the conventional bare chip mounter described above, a gravitational balance is achieved by the tensile spring 111. Therefore, if thermal expansion occurs on members connected to the tensile spring 111 (the movable part 106b of the first single-axis table, the suction bit section 102, the bare chip 101, and the like), then the tensile spring 111 expands or contracts due to this thermal expansion and the gravitational balance is disturbed. This disturbance of the gravitational balance inhibits precise determination of the mounting applied pressure.

Patent Document 1: Japanese Patent Application Publication No. 8-330790

DISCLOSURE OF THE INVENTION

The present invention has been devised in view of the aforementioned problems, an object thereof being to provide a component mounting apparatus, a component mounting head and a component mounting method whereby a minute mounting applied pressure can be determined accurately, without disturbing the gravitational balance even if the component, nozzle, and the like undergo thermal expansion.

In order to achieve the object described above, the component mounting apparatus relating to the present invention comprises:

a component mounting head comprising:
a mounting head base;
a moving body supported on the mounting head base movably in the vertical direction;
a movable part having a suction bit section and a movable shaft and supported with respect to the moving body movably at least in the vertical direction, the suction bit section thereof suctioning the component;

a weight compensation mechanism for engaging with the movable shaft to compensate for the gravitational force of the weight of the movable part or the total weight of the movable part and the component suctioned to the suction bit section of the movable part, on the basis of the weight of the movable part or the total weight of the movable part and the component suctioned to the suction bit section of the movable part;

a force determination unit for determining a force applied to the movable part in the vertical direction; and a drive unit for moving the force determination unit in the vertical direction with respect to the moving body; and a control unit for controlling the drive unit in such a manner that the determination value of the force determination unit becomes a target value when the component is mounted on a mounting object.

In the component mounting apparatus described above, the weight compensation mechanism may comprise a balance mechanism engaging with the movable part on one side of a fulcrum.

Furthermore, in the component mounting apparatus described above, the drive unit may have at least one of a voice coil motor, a linear motor and a cylinder.

Moreover, in the component mounting apparatus described above, a biasing member for increasing a load applied to the drive unit may be provided.

Furthermore, in the component mounting apparatus described above, the component mounting head may further comprise a rotating member which is rotatably supported with respect to the moving body and into an internal space of which a portion of the movable part is inserted movably in the vertical direction, and a motor for rotating the rotating member, and the suction bit section rotates in accordance with the rotation of the rotating member.

The component mounting head according to the present invention is a component mounting head provided in the component mounting apparatus described above.

In the component mounting method relating to the present invention, in the step of mounting a component suctioned to the suction bit section of a movable part onto a mounting object, the component is mounted on the mounting object, while controlling the determination value of a force determination unit for determining a force applied to the movable part in the vertical direction to a target value by moving the movable part in the vertical direction, in a state where a force for compensating for the gravitational force of the weight of the movable part or the total weight of the movable part and the component suctioned to the suction bit section of the movable part, on the basis of the weight of the movable part or the total weight of the movable part and the component suctioned to the suction bit section of the movable part, is caused to act on the movable part.

According to a preferred mode of the present invention, it is possible to determine a minute mounting applied pressure accurately without disturbing the gravitational balance, even it the movable part, the suctioned component, or the like undergoes thermal expansion.

Furthermore, according to a preferred mode of the present invention, it is possible to control the minute mounting applied pressure, with high responsiveness and accuracy by controlling the drive unit in such a manner that a small load is applied to the force determination unit in a state where the load applied to the drive unit has been increased by the biasing member.

BEST MODE FOR CARRYING OUT THE INVENTION

Below, embodiments of the present invention are described with reference to the drawings. In the respective embodiments described below, an electronic component mounting apparatus for mounting an electronic component on a substrate is described as an example of a component mounting apparatus. However, the present invention can be applied not only to an electronic component mounting apparatus but also to other apparatuses for mounting a component to be mounted on a mounting object.

First Embodiment

Figure 1:
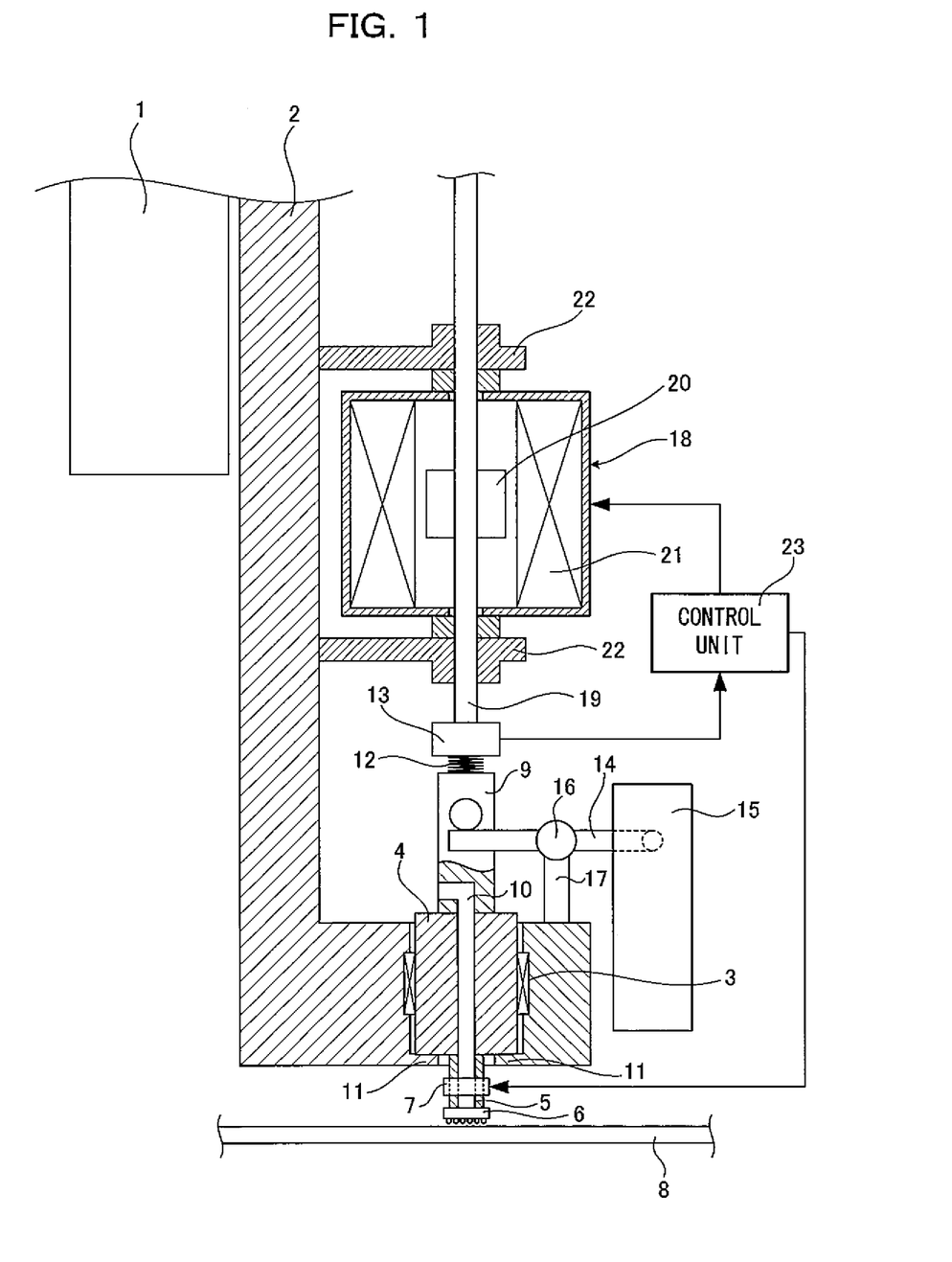
FIG. 1 is a schematic diagram showing a portion of a component mounting head according to a first embodiment of the present invention.
Figure 2:
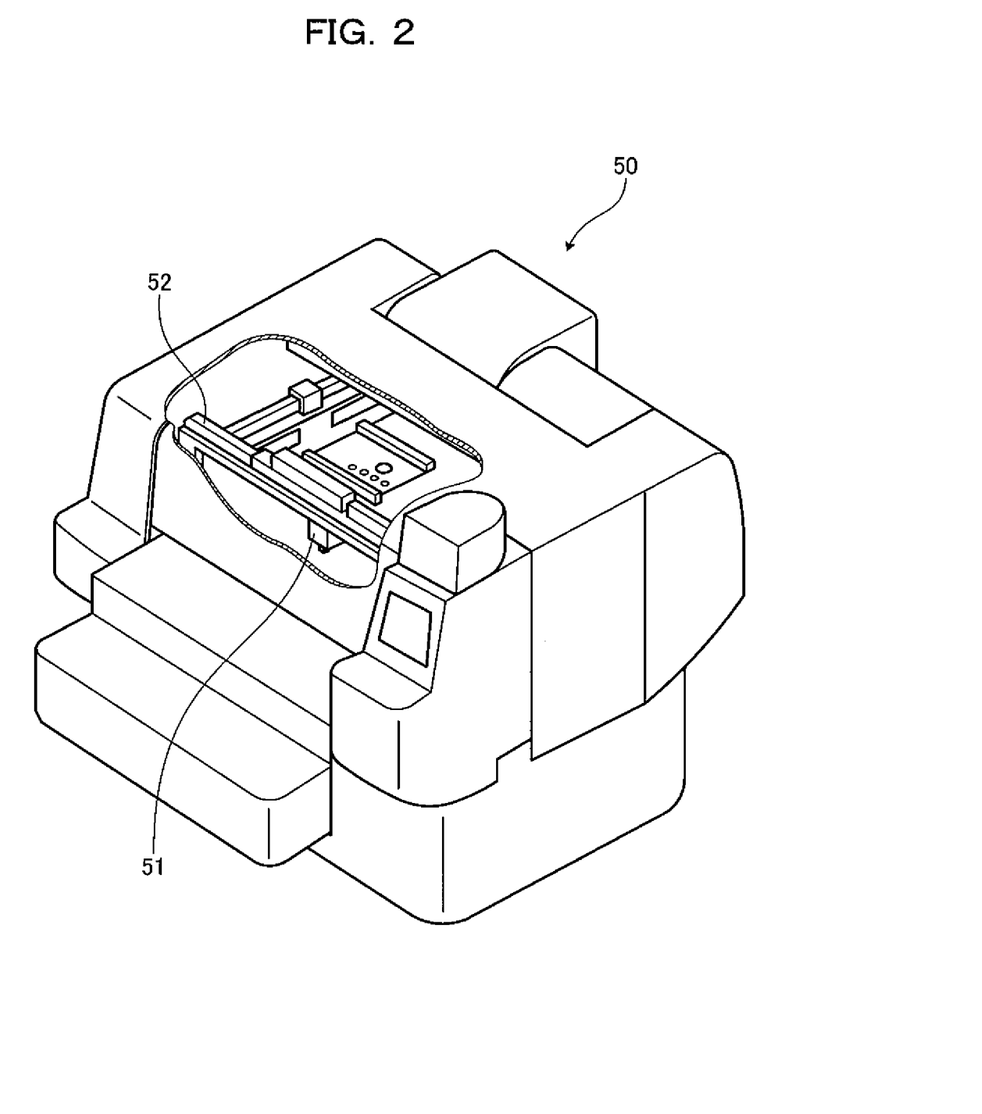
FIG. 2 is an external perspective diagram showing an electronic component mounting apparatus partially cut away to show the interior according to the first to third embodiments of the present invention.

FIG. 1 is a schematic diagram showing a portion of a component mounting head which an electronic component mounting apparatus includes according to the first embodiment of the present invention, and FIG. 2 is an external perspective diagram showing the electronic component mounting apparatus partially cut away to show the interior according to the first embodiment of the present invention.

As shown in FIG. 2, the electronic component mounting apparatus 50 includes a component mounting head 51 which is supported on an X-Y movement mechanism 52. The component mounting head 51 holds a small electronic component such as a semiconductor package, and is used to mount the held electronic component on a substrate while applying a prescribed applied pressure (mounting applied pressure) from above the substrate. The X-Y movement mechanism 52 conveys the component mounting head 51 along the X-Y plane (horizontal plane) to above a position for receiving an electronic component supplied from a component supply unit or above a position for mounting the electronic component on the substrate.

Below, the component mounting head is described in detail with reference to FIG. 1. A mounting head base 1 is supported on the X-Y movement mechanism 52 of the electronic component mounting apparatus. A moving body 2 is supported on the mounting head base 1 movably in the vertical direction. For example, it is possible to adopt a composition in which the mounting head base 1 supports the moving body 2 via a linear guide.

Furthermore, the moving body 2 is moved by a moving body movement mechanism (not shown) in the vertical direction with respect to the mounting head base 1. This moving body movement mechanism may be composed of, for example, a motor provided in the mounting head base 1, a ball screw provided on the output shaft of the motor, a nut which is fixed to the moving body 2 and engages with the ball screw, and the like. By adopting this composition, it is possible to position the moving body 2 in the vertical direction in accordance with the amount of rotation angle of the motor.

Furthermore, the moving body 2 has an inserting section into which a suction bit section 4 is inserted. The moving body 2 supports the suction bit section 4 inserted into the inserting section, movably in the vertical direction via a linear guide 3. A ball spline bearing or the like, can be used for the linear guide 3. A nozzle 5 is mounted on the front end of the suction bit section 4. The nozzle 5 projects from the lower surface of the moving body 2. An electronic component is suctioned to the front tip of this nozzle 5.

In the first embodiment, a semiconductor package 6 is described as an example of the suctioned electronic component. If an object to be mounted is a semiconductor package, then as shown in FIG. 1, a heating head 7 is provided in the nozzle 5. The heating head 7 generates heat in order to melt the solder ball of the semiconductor package.

An air suction hole 10 is formed in the suction bit section 4 and a movable shaft 9 connected to the upper part of the suction bit section 4. The air suction hole 10 opens in the outer circumferential surface of the movable shaft 9 and is communicated with a through hole of the nozzle 5. The open end of the air suction hole 10 on the side of the movable shaft 9 is connected to a vacuum generator (not shown). This vacuum generator produces a vacuum at the open end formed in the front tip of the nozzle 5. By the suctioning force of the vacuum generator, an electronic component is suctioned to the front tip of the nozzle 5.

Furthermore, a step section 11 is formed in the movable body 2 below the inserting portion into which the suction bit section 4 is inserted. In this electronic component mounting apparatus, the moving body 2 is lowered with the suction bit section 4 abutting against the step section 11, and the semiconductor package 6 contacts a substrate 8.

The movable shaft 9 is connected to a pressure-sensitive surface (pressure sensing section) of a load cell (force determination unit) 13 via a compression spring 12. The load cell 13 determines a vertical force applied to the movable part. In the first embodiment, the movable part is constituted by the nozzle 5, the heating head 7, the suction bit section 4, the movable shaft 9 and the compression spring 12. The compression spring 12 serves to protect the load cell 13. In the first embodiment, a case is described where the compression spring is used as a device for protecting the load cell, but of course the device for protecting the load cell is not limited to a compression spring, as long as the device can protect the load cell when a large load is applied to the load cell.

A rocking body 14 engages with the movable shaft 9 on one side of a fulcrum and engages with a balance weight 15 on the other side thereof. A bearing 16 is disposed in the fulcrum. The bearing 16 is supported on a support platform 17 fixed to the moving body 2. This bearing 16 rockably supports the rocking body 14. The weight of the balance weight is determined so as to balance with the total weight of the movable part comprising the suction bit section 4 and the like, and the electronic component suctioned to the suction bit section 4. The total weight of the movable part and the suctioned electronic component is compensated by this balance mechanism.

In this way, in the first embodiment, the balance mechanism is used as a weight compensation mechanism for generating a force corresponding to the total weight of the movable part and the suctioned electronic component so as to compensate for this total weight.

The composition in which the rocking body 14 engages with the balance weight 15 may be, for example, a composition in which the rocking body 14 grips a supporting axle provided on the balance weight 15 via a bearing.

Furthermore, the composition in which the rocking body 14 engages with the movable shaft 9 should be a composition not inhibiting the upward and downward movement of the movable shaft 9. For example, a composition may be adopted in which two claws are provided on the front tip of the rocking body 14 and two projections provided on the movable shaft 9 are supported by these claws.

Moreover, the bearing is disposed in the fulcrum, but the rocking body 14 may be supported by, for example, a knife-edge bearing.

Furthermore, the balance mechanism is used to compensate for the total weight of the movable part and the suctioned electronic component, but the device for compensating for the total weight (weight compensation mechanism) is not limited to a balance mechanism, as long as the device can generate an arbitrarily settable constant force. In other words, the device for compensating for the total weight should be a device capable of generating a constant force corresponding to the total weight of the movable part and the suctioned electronic component.

Moreover, the total weight of the movable part and the suctioned electronic component does not necessarily have to be compensated by 100%, but the total weight of the movable part and the suctioned electronic component should be compensated in such a manner that a minute mounting applied pressure can be controlled satisfactorily. Consequently, the compensated weight should be a weight within a range allowing a minute mounting applied pressure to be controlled satisfactorily, and for example, it is possible to generate a constant force which corresponds to the weight of the movable part.

Furthermore, as described hereinafter, it is also possible to generate a constant force equal to or greater than the total weight of the movable part and the suctioned electronic component.

A voice coil motor (drive unit) 18 for moving the load cell 13 upwards or downwards in the vertical direction with respect to the moving body 2 is provided in the moving body 2. The voice coil motor (hereinafter referred to as VCM) 18 comprises a rod 19, a magnet 20 mounted on the rod 19, and a coil 21 provided around the periphery of the magnet 20. The rod 19 can be moved along the axial direction by controlling current flowing in the coil 21.

The casing of the VCM 18 is fixed to a supporting section 22 provided on the moving body 2. The supporting section 22 supports the rod 19 slidably in the axial direction thereof.

The rod 19 is connected to the load cell 13 on the opposite surface to the pressure-sensitive surface. Therefore, by driving the VCM 18, it is possible to move the load cell 13 in the vertical direction. A force control loop is generally used to control the operation of the VCM 18.

Next, the force control loop for controlling the operation of the VCM 18 will be described. The operation of the VCM 18 is controlled by a control unit 23 of the electronic component mounting apparatus for controlling the operation of the component mounting head.

When the semiconductor package 6 suctioned to the front tip of the nozzle 5 is mounted onto the substrate 8, the moving body 2 is lowered until the semiconductor package 6 comes into contact with the substrate 8, and is then lowered further through a pushing distance. This lowering operation of the moving body 2 is carried out by means of the control unit 23 controlling the movement distance of the moving body movement mechanism (not shown) which moves the moving body 2 in the vertical direction.

In this case, the control unit 23 passes a current based on a deviation between the determination value of the load 13 and a target value through the coil 21 of the VCM 18. By this means, the load cell 13 connected to the rod of the VCM 18 is raised in such a manner that the determination value of the load cell 13 becomes the target value.

The drive unit which moves the load cell in the vertical direction and the composition which controls the drive unit are not limited to the composition described above, and it is also possible to adopt, for example, a composition which controls the position of the rod 19. The composition for controlling the position of the rod 19 may be a composition where, for example, a position detector for determining the position of the rod 19 is provided on the main body side of the VCM 18, the control unit converts the deviation between the determination value of the load cell 13 and the target value to a target position of the rod 19, and a current based on a deviation between the determination value of the position detector and a target position is passed through the coil 21 of the VCM 18. In this case, the load cell 13 connected to the rod 19 of the VCM 18 is moved in such a manner that the determination value of the position detector coincides with the target position.

Furthermore, for example, it is also possible to use a linear motor instead of the VCM. If a linear motor is used, the deviation between the determination value of the load cell and the target value may be converted to a target position of the rod of the linear motor, and the rod of the linear motor may be moved in such a manner that the determination value of the position detector for determining the position of the rod of the linear motor coincides with the target position.

Moreover, for example, it is also possible to use a cylinder instead of the VCM, and if a cylinder is used, a pressure for moving the piston of the cylinder in the vertical direction should be controlled, and therefore the determination value of the load cell can be controlled to the target value by means of a simple method.

Next, a case where the target value of the determination value of the load cell 13 is set to 10 gf is described as an example of the operation of the component mounting head.

The control unit 23 of the electronic component apparatus applies a downward force of 10 gf to the rod 19 by driving the VCM 18. In this case, the suction bit section 4 abuts against the step section 11 with a force of 10 gf.

In this state, the control unit 23 controls the movement distance of the moving body movement mechanism (not shown) which moves the moving body 2 in the vertical direction, and the control unit 23 lowers the moving body 2 until the semiconductor package 6 comes into contact with the substrate 8, whereupon the moving body 2 is lowered further through the pushing distance.

Figure 3:
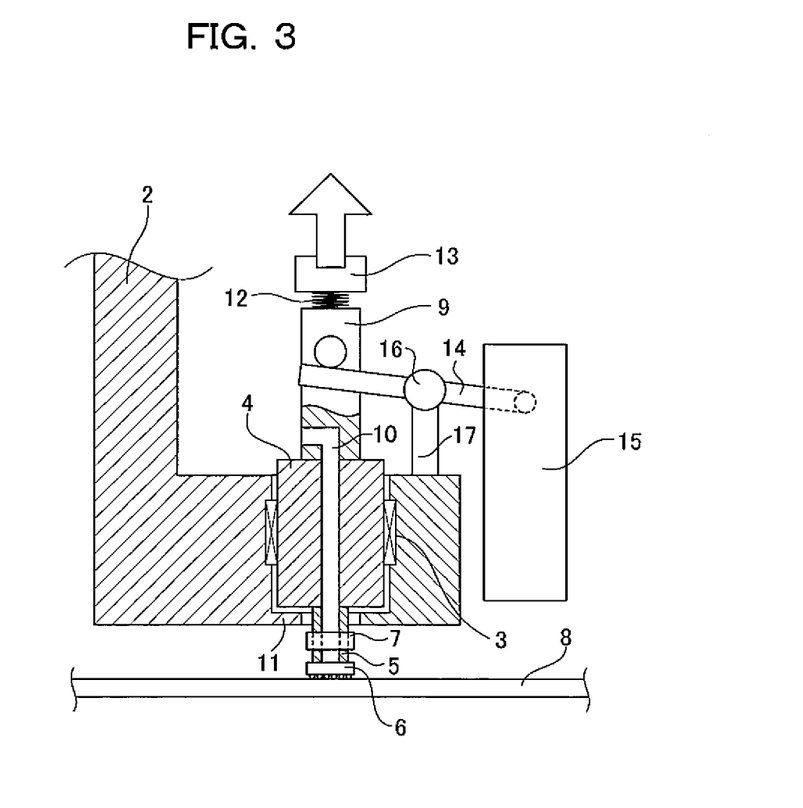
FIG. 3 is a diagram for explaining the operation of the component mounting head according to the first embodiment of the present invention.

FIG. 3 shows a state where the moving body 2 has been lowered further through the pushing distance. At this point, the control unit 23 passes a current based on the deviation between the determination value of the load cell 13 and the target value through the coil 21 of the VCM 18. Accordingly, the load cell 13 connected to the rod 19 of the VCM 18 is raised in such a manner that the determination value of the load cell 13 becomes the target value. In this case, since the suction bit section 4 is raised and separated from the step section 11, it is possible to determine a force applied to the semiconductor package 6 (mounting applied pressure) by means of the load cell 13.

By this means, it is possible to maintain the force applied to the semiconductor package 6 (mounting applied pressure) at 10 gf. Under this mounting applied pressure, the control unit 23 causes the heating head 7 to generate heat. Thereupon, the control unit 23 releases the suctioning of the semiconductor package 6 by the suction bit section 4 by halting the vacuum generator, and then causes the moving body 2 to be raised. In accordance with the raising of the moving body 2, the suction bit section 4 is lowered and abuts against the step section 11.

As described above, in the first embodiment, the semiconductor package 6 is mounted on the substrate 8, while controlling the VCM for moving the load cell 13 in the vertical direction in such a manner that the determination value of the load cell 13 for determining a force applied in the vertical direction to the movable part made up of the suction bit section 4 and the like becomes the target value.

According to the first embodiment, the balance mechanism (weight compensation mechanism) which generates a constant force compensates for the total weight of the movable part made up of the suction bit section and the like and the electronic component suctioned by the suction bit section, and it is therefore possible to avoid disturbance of the gravitational balance caused by thermal expansion of the movable part and the suctioned electronic component and the like.

Moreover, according to the first embodiment, since the total weight of the movable part and the suctioned electronic component is compensated by the balance mechanism (weight compensation mechanism), an impact force applied to the pressure-sensitive surface (pressure sensing section) of the load cell when the electronic component contacts the substrate is suppressed. Consequently, it is possible to use a load cell which has high resolution and is capable of determining a minute force, and the minute applied pressure when mounting the electronic component on the substrate (mounting applied pressure) can be determined accurately.

Furthermore, according to the first embodiment, since a current is passed through the coil of the VCM from before the electronic component contacts the substrate, and the minute mounting applied pressure is controlled by means of the VCM in this state, then it is possible to improve the responsiveness of the VCM when mounting the electronic component, and to accurately control the minute mounting applied pressure.

The first embodiment described the case where the weight of the balance weight is set to a weight corresponding to the total weight of the movable part and the suctioned electronic component, but it is also possible to use a balance weight which is slightly heavier than the total weight of the movable part and the suctioned electronic component.

In this case, an upward force is applied to the movable part by the balance weight. This upward force is a force corresponding to the differential weight obtained by subtracting the total weight of the movable part and the suctioned electronic component from the weight of the balance weight. The force corresponding to this differential weight is applied to the pressure-sensitive surface (pressure sensing section) of the load cell at all times. Therefore, the force determined by the load cell is a value obtained by adding the force applied to the pressure-sensitive surface (pressure sensing section) of the load cell by the balance weight (balance mechanism) to the mounting applied pressure when the electronic component suctioned to the front tip of the nozzle is mounted on the substrate.

Consequently, for example, if the differential weight obtained by subtracting the total weight of the movable part and the suctioned electronic component from the weight of the balance weight is "10 gf", then the target value of the determination value of the load cell may be set to "20 gf", in a case where the force applied to the electronic component suctioned to the front tip of the nozzle (mounting applied pressure) is controlled to "10 gf".

In the case where the balance weight that is slightly heavier than the total weight of the movable part and the suctioned electronic component is used in this way and a load is applied to the pressure-sensitive surface (pressure sensing section) of the load cell by the balance weight, even if the target value of the determination value of the load cell is increased, it is possible to control the force applied to the electronic component suctioned to the front tip of the nozzle (mounting applied pressure) to a small value, and therefore the mounting applied pressure can be minutely controlled.

Furthermore, in the first embodiment, the composition was described in which the moving body 2 supports the suction bit section 4 movably in the vertical direction via the linear guide 3, but the invention is of course not limited to this composition and the suction bit section 4 can be supported by a pneumatic bearing, for instance.

Figure 4:
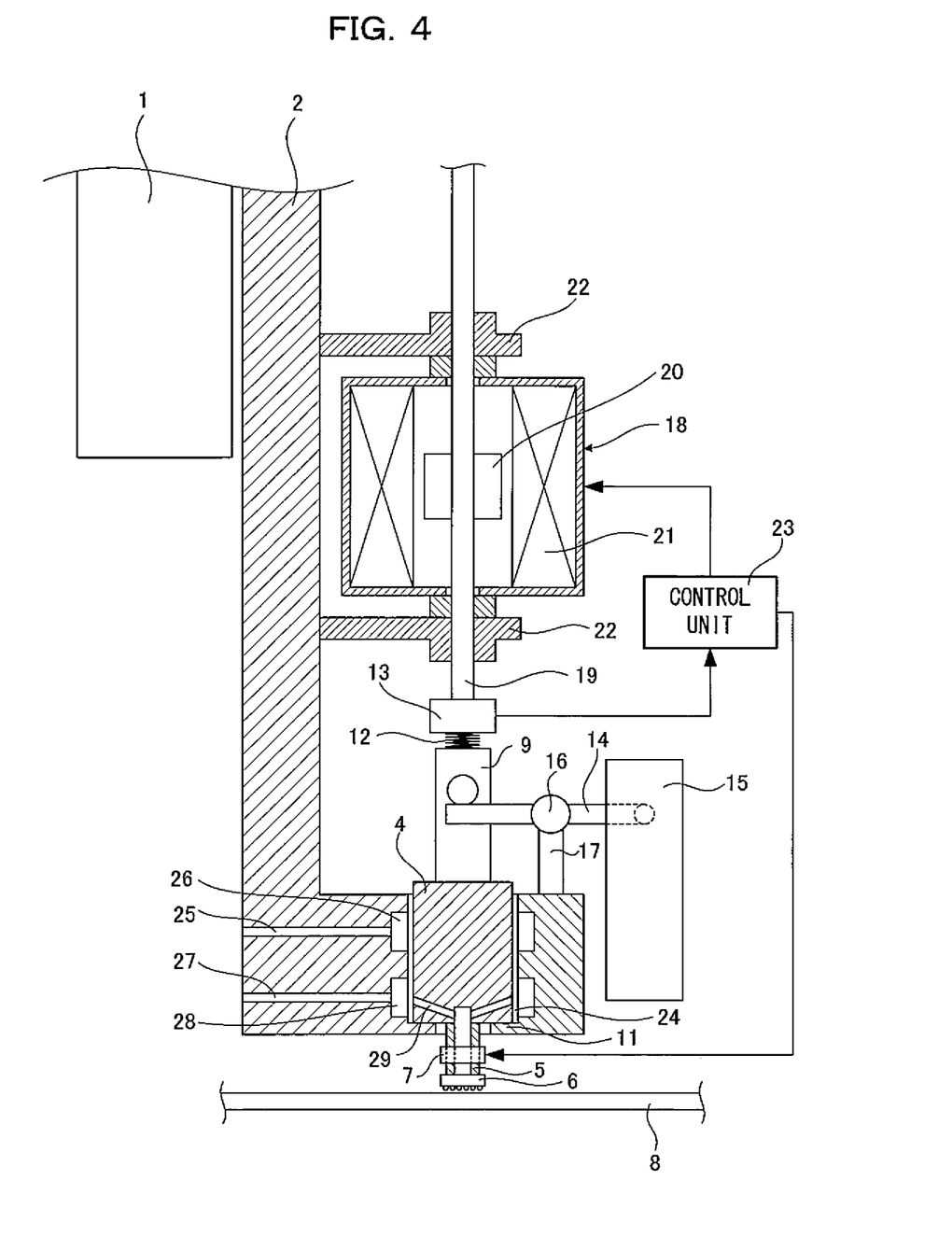
FIG. 4 is a schematic diagram showing a portion of a further example of the component mounting head according to the first embodiment of the present invention.

FIG. 4 shows an example of the composition in which the moving body 2 supports the suction bit section 4 movably in the vertical direction by means of the pneumatic bearing. Here, members which correspond to the members described already are labeled with the same reference numerals and a description thereof is omitted as appropriate.

As shown in FIG. 4, an air supply hole 25 which opens in the outer surface of the moving body 2 is formed in the moving body 2. Furthermore, a ring-shaped air supply chamber 26 is formed in the moving body 2 in the inner circumferential surface of the inserting section where the suction bit section 4 is inserted (referred to as the inner circumferential surface of the moving body 2 below). The air supply hole 25 is communicated with the air supply chamber 26. Furthermore, an air supply apparatus (not shown) is connected to the open end of the air supply hole 25 on the outer surface of the moving body 2.

With this configuration, by supplying air from the air supply apparatus (not shown) to the air supply chamber 26 via the air supply hole 25, it is possible to configure a pneumatic bearing 24 in a gap between the inner circumferential surface of the moving body 2 and the outer circumferential surface of the suction bit section 4.

Furthermore, by forming the ring-shaped air supply chamber 26, it is possible to configure the pneumatic bearing 24 around the entire outer circumferential surface of the suction bit section 4.

By supporting the suction bit section by means of the pneumatic bearing in this way, it is possible to determine with high accuracy the minute mounting applied pressure when the electronic component suctioned to the front tip of the nozzle is mounted on the substrate without causing friction.

Although the air supply chamber 26 is formed in the inner circumferential surface of the moving body 2, it is also possible to form the ring-shaped air supply chamber inside the moving body 2, as well as forming a plurality of communication holes which communicate with this air supply chamber and open to the inner circumferential surface of the moving body. Furthermore, it is also possible to form the ring-shaped air supply chamber in the outer circumferential surface of the suction bit section 4.

Moreover, in the first embodiment, a vacuum is generated at the front tip of the nozzle by suctioning air via the open end of the air suction hole 10 formed in the outer circumferential surface of the movable shaft 9, but the invention is of course not limited to this composition and the composition shown in FIG. 4, for instance, may also be adopted.

Specifically, an air suction hole 27 which opens in the outer surface of the moving body 2 is formed in the moving body 2. Furthermore, a ring-shaped air suction chamber 28 is formed in the inner circumferential surface of the moving body 2 and the air suction hole 27 is communicated with this air suction chamber 28. A vacuum generating apparatus (not shown) is connected to the open end of the air suction hole 27 on the outer surface of the moving body 2. The air suction chamber 28 may be formed on the outer circumferential surface of the suction bit section 4.

On the other hand, a plurality of air suction holes 29 which communicate with the through hole of the nozzle 5 and open to the outer circumferential surface of the suction bit section 4 are formed in the suction bit section 4. The open ends of these air suction holes 29 on the outer circumferential surface of the suction bit section 4 are formed so as to oppose the air suction chamber 28 formed in the inner circumferential surface of the moving body 2. When the air suction chamber 28 is formed on the outer circumferential surface of the suction bit section 4, then the air suction holes 29 are formed so as to communicate with this air suction chamber 28.

With this configuration, it is possible to produce a vacuum at the front tip of the nozzle 5 by suctioning air from the open end of the air suction hole 27 on the outer surface of the moving body 2. Here, the flow rate of the air suctioned from the air suction hole 27 is greater than the flow rate of the air supplied to the air supply hole 25.

Second Embodiment

Figure 5:
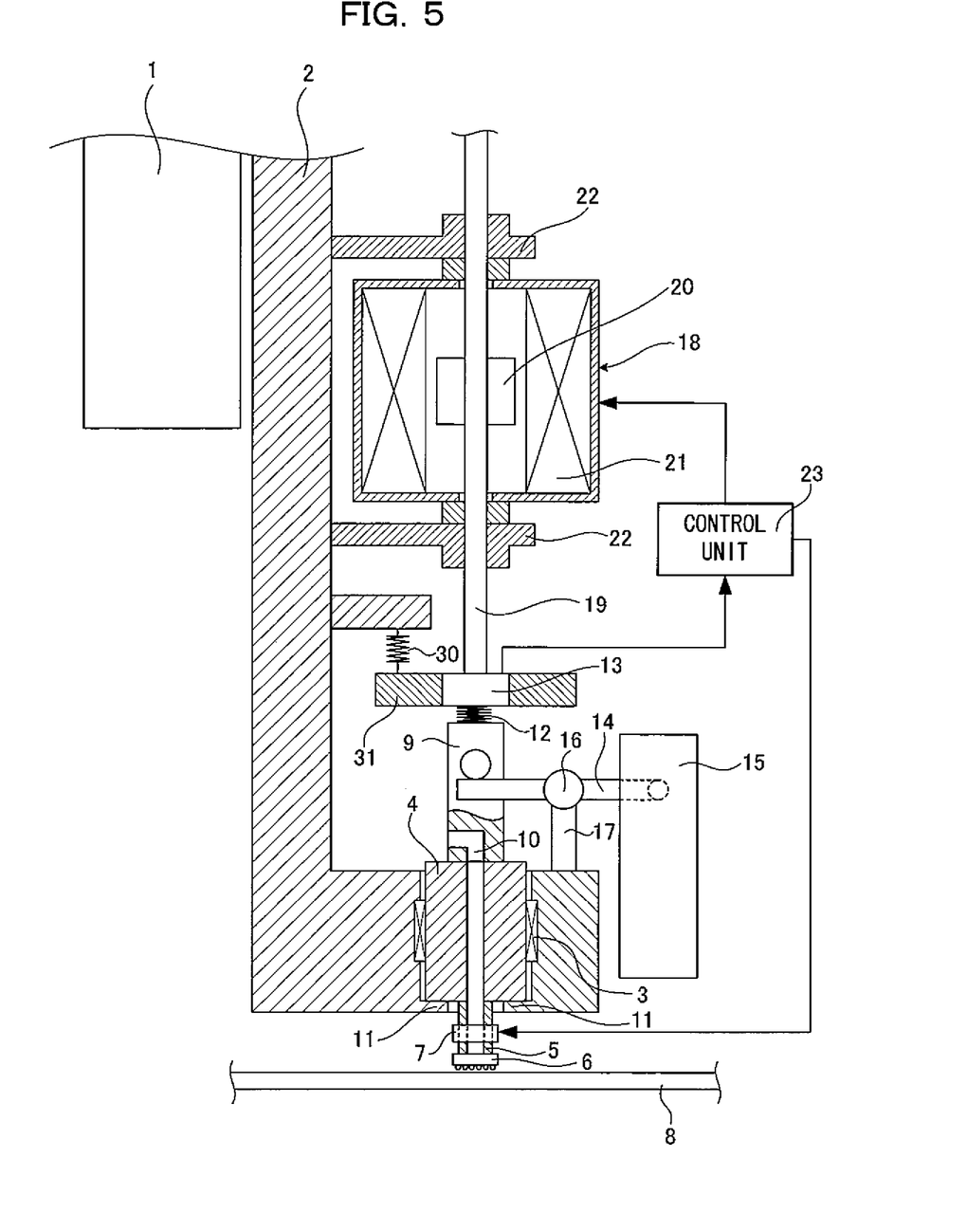
FIG. 5 is schematic diagram showing a portion of a component mounting head according to a second embodiment of the present invention.

Below, a second embodiment of the present invention is described with respect to differences from the first embodiment described above. FIG. 5 is a schematic diagram showing the composition of a portion of a component mounting head which an electronic component mounting apparatus includes according to the second embodiment of the present invention. Here, members which are the same as the members described in the first embodiment are labeled with the same reference numerals.

As shown in FIG. 5, the second embodiment differs from the first embodiment described above in that a tensile spring 30 is provided in the component mounting head as a biasing member for increasing a load applied to the VCM 18. One end of the tensile spring 30 engages with a projection provided on a moving body 2 and the other end thereof engages with a holding member 31 for holding a load cell 13.

Next, the operation of this component mounting head will be described with reference to an example where the tensile force of the tensile spring 30 is 200 gf and the target value of the determination value of the load cell 13 is set to 1 gf.

A control unit 23 of the electronic component mounting apparatus drives the VCM 18 so as to apply a downward force of 201 gf to a rod 19. At this point, the determination value of the load cell 13 is 1 gf. Furthermore, at this point, a suction bit section 4 is abutted against a step section 11 with a force of 1 gf.

In this state, the control unit 23 controls the movement distance of a moving body movement mechanism (not shown) for moving the moving body 2 in the vertical direction so as to lower the moving body 2 until a semiconductor package 6 contacts a substrate 8, whereupon the moving body 2 is lowered further through a pushing distance.

When the moving body 2 is lowered further through the pushing distance, then the control unit 23 passes a current based on a deviation between the determination value of the load cell 13 and a target value, through a coil 21 of the VCM 18. By this means, the load cell 13 connected to the rod 19 of the VCM 18 is raised in such a manner that the determination value of the load cell 13 becomes the target value. At this point, since the suction bit section 4 is raised and separated from the step section 11, then a force applied to the semiconductor package 6 (mounting applied pressure) can be determined by the load cell 13.

With this configuration, it is possible to maintain the force applied to the semiconductor package 6 (mounting applied pressure) at 1 gf. Under the mounting applied pressure, the control unit 23 causes a heating head 7 to generate heat. Thereupon, the control unit 23 halts a vacuum generator, thereby releasing the suctioning of the semiconductor package 6 by the suction bit section 4, and then the control unit 23 raises the moving body 2. In accordance with the raising of the moving body 2, the suction bit section 4 is lowered and abuts against the step section 11.

As described above, in the second embodiment, the VCM 18 is driven in such a manner that the determination value of the load cell 13 becomes the target value, in a state where the VCM 18 is generating a downward force so as to eliminate the tensile force of the tensile spring 30.

According to the second embodiment, since a load applied to the VCM is increased and a current passing through the coil of the VCM is increased from before the electronic component comes into contact with the substrate, and the minute mounting applied pressure is controlled by the VCM in this state, then it is possible to further enhance the responsiveness of the VCM when mounting the electronic component and to control a minuter mounting applied pressure with high accuracy.

A drive unit for moving the load cell in the vertical direction and a composition for controlling the drive unit are not limited in particular to the composition described above, and as explained in the first embodiment above, it is also possible to adopt a composition for controlling the position of the rod 19 of the VCM 18, for example, or a composition using a linear motor and cylinder instead of the VCM.

Furthermore, similarly to the first embodiment described above, it is also possible to apply a load to the pressure-sensitive surface (pressure sensing section) of the load cell by means of a balance weight by using the balance weight which is slightly heavier than the total weight of a movable part and the suctioned electronic component.

Moreover, as described in the first embodiment above, it is possible to support the suction bit section 4 by means of a pneumatic bearing. Furthermore, a composition for generating a vacuum at the front tip of a nozzle is not limited to the composition for suctioning air from the open end of an air suction hole 10 formed on the outer circumferential surface of a movable shaft 9, and as described in the first embodiment, air may be suctioned from the outer surface of the moving body 2 and a vacuum may be generated at the front tip of the nozzle via a gap between the inner circumferential surface of the moving body 2 and the outer circumferential surface of the suction bit section 4.

In the first and second embodiments described above, the electronic component suctioned to the suction bit section is moved in the horizontal plane and in the vertical direction, but if it is necessary to correct rotation in order to mount the electronic component on the substrate, for example, the suction bit section may be prevented from rotating with respect to the moving body 2 and the whole of the moving body 2 may be then rotated.

When a pneumatic bearing is configured between the moving body 2 and the suction bit section 4, then in order to prevent the suction bit section 4 from rotating with respect to the moving body 2, for example, the horizontal cross-sectional shape of the inserting section of the moving body 2 into which the suction bit section is inserted and the horizontal cross-sectional shape of the suction bit section 4 may be both a polygonal shape such as a quadrilateral shape, or a projection may be provided in one of the moving body 2 and the suction bit section 4 so as to engage with a groove provided in the other.

Third Embodiment

Figure 6:
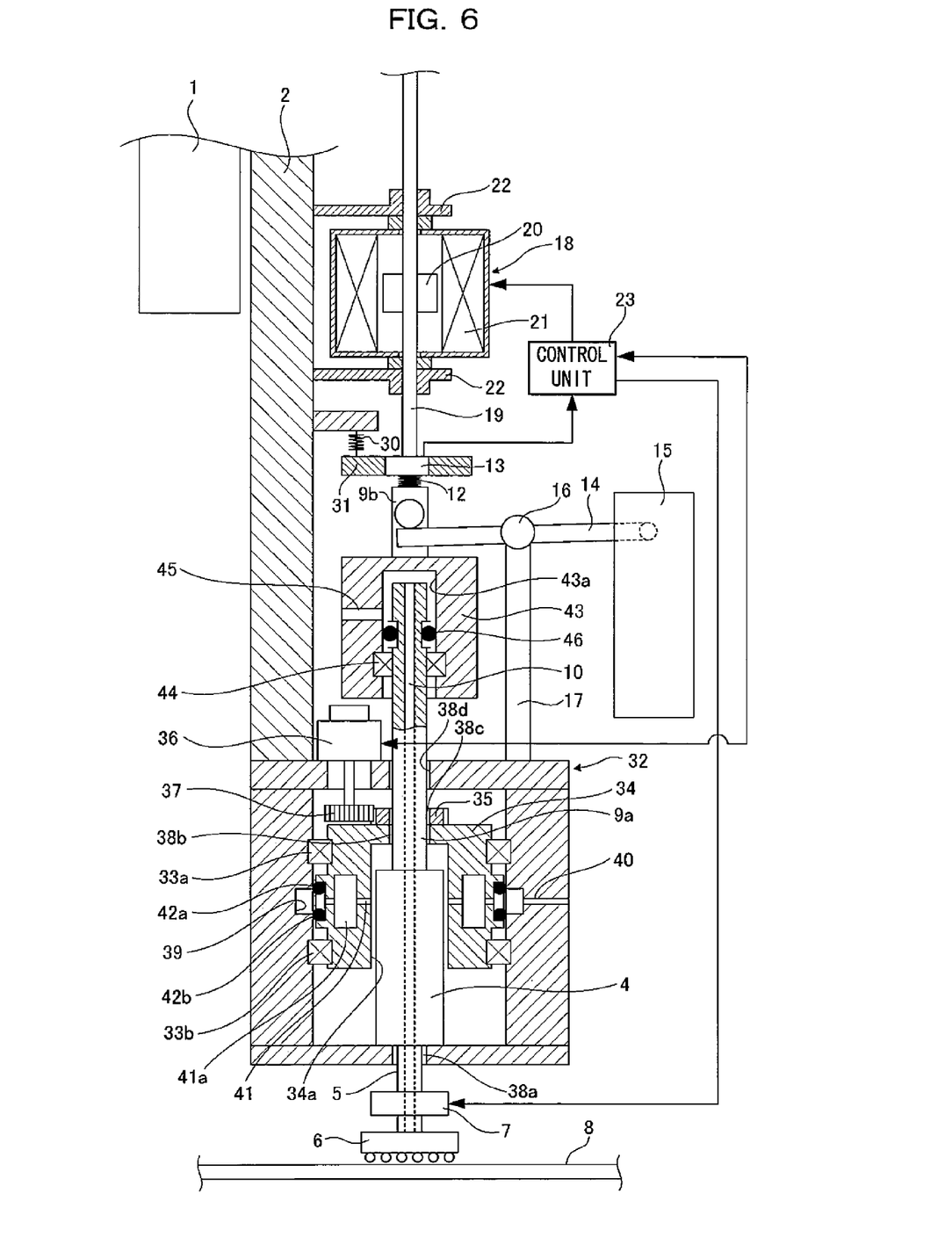
FIG. 6 is a schematic diagram showing a portion of a component mounting head according to a third embodiment of the present invention.

Below, a third embodiment according to the present invention is described with respect to differences from the first and second embodiments described above. This third embodiment differs from the first and second embodiments described above in that a component mounting head is composed in such a manner that a suction bit section 4 is rotatable, rather than rotating the whole of a moving body 2.

FIG. 6 is a schematic diagram showing the composition of a portion of a component mounting head which an electronic component mounting apparatus includes according to the third embodiment of the present invention. Members which are the same as the members described in the first and second embodiments above are labeled with the same reference numerals.

As shown in FIG. 6, the lower portion of the moving body 2 forms a casing 32. A rotating member 34 is mounted inside the casing 32 via bearings 33a and 33b. Consequently, the rotating member 34 is supported rotatably with respect to the casing 32 (moving body 2).

A gear wheel 35 is mounted on the upper surface of the rotating member 34 in a state where the center of the gear wheel coincides with the center of the rotating member 34. Furthermore, a motor 36 is mounted on the ceiling portion of the casing 32, and the output shaft of the motor projects inside the casing 32. A gear wheel 37 is mounted on the output shaft of the motor 36 and this gear wheel 37 engages with the gear wheel 35 mounted on the upper surface of the rotating member 34. Consequently, when the motor 36 is driven, then the rotating member 34 rotates with respect to the casing 32 (moving body 2) while being guided by the bearings 33a and 33b.

The rotating member 34 has a hollow structure which is open to the lower side. The suction bit section 4 is inserted into a hollow portion (internal space) 34a of the rotating member 34. A nozzle 5 connected to the lower end of the suction bit section 4 projects to the exterior of the casing 32 via a hole 38a formed in the lower portion of the casing 32. In the third embodiment, the lower portion of the casing 32 is used as a step section against which the lower end of the suction bit section 4 abuts.

On the other hand, the lower end of a first movable shaft 9a is connected to the upper end of the suction bit section 4. This first movable shaft 9a is extended to the exterior of the casing 32 via a hole 38b formed in the upper portion of the rotating member 34, a hole 38c formed in the gear wheel 35 and a hole 38d formed in the ceiling portion of the casing 32. A holder section 43 is disposed above the casing 32. This holder section 43 has a hollow structure which is open to the lower side. The upper end of the first movable shaft 9a is inserted into a hollow section 43a of the holder section. The holder section 43 supports the first movable shaft 9a rotatably via a bearing 44.

An air supply hole 40 which opens in the outer surface of the casing 32 is formed in the casing 32. Furthermore, a ring-shaped air supply chamber 39 is formed in the inner circumferential surface of the casing 32. The air supply hole 40 is in communication with the air supply chamber 39.

On the other hand, a plurality of air supply holes 41 are formed in the rotating member 34 and the holes open in the outer circumferential surface and the inner circumferential surface of the rotating member 34. The open ends of the air supply holes 41 on the outer circumferential surface of the rotating member 34 are formed so as to oppose the ring-shaped air supply chamber 39.

Air seals 42a and 42b as sealing devices are arranged at an interval in the vertical direction between the inner circumferential surface of the casing 32 and the outer circumferential surface of the rotating member 34, in such a manner that air can be supplied in an airtight state from the ring-shaped air supply chamber 39 to the air supply holes 41 in the rotating member 34. Here, O rings are used for the air seals 42a and 42b, but the seals may also be constituted by Y packing members.

With this configuration, air supplied from the open end of the air supply hole 40 disposed on the outer surface of the casing 32 is supplied to the airtight area of the air supply chamber 39 located between the air seals 42a and 42b, and the air supplied to this airtight area of the air supply chamber 39 is released to a gap between the inner circumferential surface of the rotating member 34 and the outer circumferential surface of the suction bit section 4 via the air supply holes 41 in the rotating member 34. By this means, a pneumatic bearing is configure between the rotating member 34 and the suction bit section 4.

As shown in FIG. 6, it is possible to provide an air holding chamber 41a around the whole circumference of the rotating member 34 at the intermediate position of the air supply hole 41. The air holding chamber 41a is formed so as to have a larger cross-sectional area than the open ends of the air supply holes 41 in the inner circumferential surface of the rotating member 34. By providing the air holding chamber 41a in this way, it is possible to ensure a stable pressure between the rotating member 34 and the suction bit section 4.

In the composition described above, the horizontal cross-sectional shape of the hollow section 34a of the rotating member 34 is a quadrilateral shape and the horizontal cross-sectional shape of the suction bit section 4 which engages with the hollow section 34a via a gap for the pneumatic bearing is also a quadrilateral shape, so that it is possible to rotate the suction bit section 4 in unison with the rotation of the rotating member 34. The horizontal cross-sectional shape of the hollow section 34a of the rotating member 34 and the horizontal cross-sectional shape of the suction bit section 4 are not limited to a quadrilateral shape, and the horizontal cross-sectional shape of the hollow section 34a of the rotating member 34 and the horizontal cross-sectional shape of the suction bit section 4 may be both a polygonal shape. Furthermore, it is also possible to form a projection in one of the rotating member 34 and the suction bit section 4 to engage with a groove provided in the other.

A second movable shaft 9b of a movable part is connected to the upper surface of the holder section 43, and the upper end of the second movable shaft 9b is connected to the pressure-sensitive surface of a load cell via a compression spring 12. Therefore, the second movable shaft 9b connected to the load cell 13 does not rotate.

A rocking body 14 engages with the second movable shaft 9b. In this third embodiment, the weight of a balance weight 15 is determined so as to balance with the total weight of the suctioned electronic component and the movable part which is made up of the nozzle 5, a heating head 7, the suction bit section 4, the first movable shaft 9a, the holder section 43, the second movable shaft 9b, and the like.

Similarly to the first and second embodiments described above, it is possible to use a balance weight which is slightly heavier than the total weight of the movable part and the suctioned electronic component, so that a load caused by the balance weight is applied to the pressure-sensitive section (pressure sensing surface) of the load cell.

Next, the composition for vacuum suctioning the electronic component to the front tip of the nozzle will be described. In the third embodiment, an air suction hole 10 which communicates with the through hole of the nozzle 5 is formed from a portion of the suction bit section 4 where the nozzle 5 is mounted through the upper end of the first movable shaft 9a. The air suction hole 10 is open on the upper end of the first movable shaft 9a and communicates with the hollow section (internal space) 43a of the holder section 43. Furthermore, an air suction hole 45 which opens in the outer circumferential surface and the inner circumferential surface of the holder section 43 is formed in the holder section 43. A vacuum generator (not shown) is connected to the open end of the air supply hole 45 in the outer circumferential surface of the holder section 43. Furthermore, an air seal 46 is disposed as a sealing device which seals with airtightness the interior space of the holder, section 43, between the outer circumferential surface of the first movable shaft 9a and the inner circumferential surface of the holder section 43.

With this configuration, it is possible to suction the electronic component to the front tip of the nozzle 5 by vacuating the front tip of the nozzle 5 by means of the vacuum generator. Here, an O ring is used for the air seal 46, but it is also possible to constitute the seal by means of a Y packing member.

With the composition described above, it is possible to rotate the suction bit section 4 with respect to the moving body 2. Furthermore, a control unit 23 of the electronic component mounting apparatus controls the motor 36 so as to generate a prescribed amount of angular rotation on the basis of the output of an encoder (not shown) for determining the angle of rotation of the motor 36, and therefore it is possible to adjust the orientation of the electronic component suctioned to the front tip portion of the nozzle 5.

In the third embodiment, a pneumatic bearing is configured between the rotating member 34 and the suction bit section 4, but it is also possible to mount the suction bit section 4 on the rotating member 34 by means of a linear guide such as a ball spline bearing. Furthermore, similarly to the first embodiment described above, the composition for producing a vacuum at the front tip of the nozzle may be a composition in which air is suctioned from the outer surface of the moving body 2 (casing 32), and a vacuum is produced at the front tip of the nozzle via the gap between the inner circumferential surface of the moving body 2 (casing 32) and the outer circumferential surface of the rotating member 34 and via the gap between the inner circumferential surface of the rotating member 34 and the outer circumferential surface of the suction bit section 4.

The first to third embodiments described cases where a semiconductor package is mounted on a substrate, but the present invention is not restrictive and can also be implemented in an electronic component mounting apparatus for mounting an electronic component onto solder paste which has been applied to a substrate by a component mounting head which does not have the heating head 7.

INDUSTRIAL APPLICABILITY

The component mounting apparatus, component mounting head and component mounting method according to the present invention make it possible to determine a minute mounting applied pressure accurately without disturbing the gravitational balance, even if a component, nozzle, or the like undergoes linear expansion. Hence the component mounting apparatus, component mounting head and component mounting method are useful for component mounting apparatuses for mounting semiconductor packages, which have been reduced in size and thickness, onto substrates.

The invention claimed is:

1. A component mounting method, comprising:
   suctioning a component to a suction bit section of a movable part, and
   mounting the component onto a mounting object,
   wherein, in mounting the component suctioned to the suction bit section of the movable part onto the mounting object, the component is mounted on the mounting object, while controlling a determination value of a force determination unit for determining a force applied to the movable part in a vertical direction to a target value by moving the movable part in the vertical direction, in a state where a force for compensating for a gravitational force of a weight of the movable part or a total weight of the movable part and the component suctioned to the suction bit section of the movable part, on a basis of the weight of the movable part or the total weight of the movable part and the component suctioned to the suction bit section of the movable part, is caused to act on the movable part by a balance mechanism engaging with a movable shaft of the movable part on one side of a fulcrum and engaging with a balance weight on another side of the fulcrum, the fulcrum being placed between the movable part and the balance weight, and the balance weight having a weight determined on a basis of the weight of the movable part or the total weight of the movable part and the component suctioned to the suction bit section of the movable part.

2. A component mounting method, comprising:
   suctioning a component to a suction bit section of a movable part;
   controlling a determination value of a force determination unit to determine a force to be applied to the movable part in a vertical direction to a target value by moving the movable part in the vertical direction; and
   mounting the component onto a mounting object;
   wherein a force for compensating for a gravitational force of a weight of the movable part or a total weight of the movable part and the component suctioned to the suction bit section of the movable part is caused to act on the movable part by a balance mechanism engaging with a movable shaft of the movable part on one side of a fulcrum and engaging with the balance weight on another side of the fulcrum,
   wherein the fulcrum is placed between the movable part and the balance weight, and
   wherein the balance weight has a weight determined on a basis of the weight of the movable part or the total weight of the movable part and the component suctioned to the suction bit section of the movable part.

* * * * *

UNITED STATES PATENT AND TRADEMARK OFFICE
CERTIFICATE OF CORRECTION

| | | |
|---|---|---|
| PATENT NO. | : 8,413,322 B2 | Page 1 of 1 |
| APPLICATION NO. | : 12/741719 | |
| DATED | : April 9, 2013 | |
| INVENTOR(S) | : Higuchi et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 149 days.

Signed and Sealed this
Twelfth Day of November, 2013

Teresa Stanek Rea
*Deputy Director of the United States Patent and Trademark Office*